US006647073B2

(12) United States Patent
Tapio

(10) Patent No.: US 6,647,073 B2
(45) Date of Patent: Nov. 11, 2003

(54) LINEARISATION AND MODULATION DEVICE

(75) Inventor: Olli Tapio, Jaali (FI)

(73) Assignee: Nokia Corporation, Espoo (FI)

(*) Notice: Subject to any disclaimer, the term of this patent is extended or adjusted under 35 U.S.C. 154(b) by 148 days.

(21) Appl. No.: 09/999,569

(22) Filed: Nov. 1, 2001

(65) Prior Publication Data

US 2002/0105378 A1 Aug. 8, 2002

Related U.S. Application Data

(63) Continuation of application No. PCT/EP99/03610, filed on May 25, 1999.

(51) Int. Cl.[7] ................................................ H04B 15/00
(52) U.S. Cl. ..................... 375/297; 330/75; 330/149; 455/126
(58) Field of Search .................. 375/296, 297, 375/284, 285, 302; 455/126; 330/75, 149, 151

(56) References Cited

U.S. PATENT DOCUMENTS

| 5,448,203 | A | | 9/1995 | Matui et al. | |
|---|---|---|---|---|---|
| 5,770,971 | A | * | 6/1998 | McNicol | 330/52 |
| 5,834,985 | A | | 11/1998 | Sundegard | |
| 6,052,568 | A | * | 4/2000 | Williams | 455/126 |
| 6,091,297 | A | * | 7/2000 | Bar-David et al. | 330/149 |
| 6,271,724 | B1 | * | 8/2001 | Neffling | 330/149 |

FOREIGN PATENT DOCUMENTS

| EP | 0658975 | 6/1995 |
|---|---|---|
| EP | 0823805 | 2/1998 |

OTHER PUBLICATIONS

International Search Report for PCT/EP99/03610.

* cited by examiner

Primary Examiner—Amanda T. Le
(74) Attorney, Agent, or Firm—Squire, Sanders & Dempsey L.L.P.

(57) ABSTRACT

The present invention discloses a linearisation and modulation device for a power amplifier. The linearisation and modulation device comprises a digital vector modulator (103, 104, 105) for generating a modulated digital signal (IF_MOD) on the basis of digital baseband signals (IIN, QIN) and digital carrier signals (PH_S, PH_C); a correction value generating means (114, 108; 114a 108a) for generating an amplitude correction value (CV_AMAM) and a phase correction value (CV_AMPM) on the basis of said digital baseband signals (IIN, QIN) and on the basis of a non-linearity distortion generated in said power amplifier (6) arranged in a subsequent stage; an amplitude correction means (106) for generating a corrected digital signal (IF_OUT) on the basis of said modulated digital signal (IF_MOD) and said amplitude correction value (CV_AMAM); a phase correction means (111) for generating a corrected phase control signal on the basis of said phase correction value and an output signal of a phase control signal generation means (110); and a carrier signal generating means (112) for generating said carrier signals (PH_S, PH_C) on the basis of an output of said phase correction means (111). With such a device, a combined modulator and lineariser can be constructed, which leads to a compact system.

13 Claims, 7 Drawing Sheets

LINEARISATION AND MODULATION DEVICE

This application is a continuation of PCT/EP99/03610 filed May 25, 1999.

FIELD OF THE INVENTION

The present invention relates to a linearisation and modulation device, and especially to a combined digital predistortion and DDS vector modulator linearisation device for a power amplifier.

BACKGROUND OF THE INVENTION

In the field of radio communication, an RF signal to be transmitted via an antenna, for example, is usually modulated from two baseband signals which are orthogonal to each other. One signal is an in-phase signal (I signal), and the other signal is a quadrature-phase signal (Q signal). These baseband signals (I and Q) are converted to a bandpass signal by an IQ mixer. The principle of such an IQ-mixer is described with reference to FIG. 6. Inside the IQ mixer the I signal is modulated with an in-phase carrier and the Q signal is modulated with a quadrature-phase carrier. The modulated signals are summed together to form a bandpass signal.

The conversion from the baseband signals to the bandpass signal can be effected directly to a radio frequency (RF) signal or first to an intermediate frequency (IF) signal and then to an RF signal. In a digital IQ mixer the signal is first converted to a digital IF signal, which is then converted to analogue form by means of a digital-analogue (D/A) converter. This analogue signal is then upconverted to an RF signal, or even firstly to a second IF signal and then to the RF signal. This is because of the limitation of speed of digital devices and DA converters. However, since the processing speed of digital devices is currently increasing, it might be possible in the future to convert signals directly into an RF signal also by means of a digital device.

Before the RF signal is supplied to the antenna, it has to be amplified by a power amplifier PA.

In such an arrangement, it is essential that the power amplifier is power-efficient and at the same time shows a very low non-linear distortion in order to prevent a degradation of the RF signal to be transmitted. However, available power amplifiers suffer from non-linear characteristics. In the frequency domain, the effect of such a non-linear power amplifier occurs as a widening of the original spectrum.

In FIG. 7, spectrums of four channels are shown, wherein channel 3 exhibits the above-mentioned widening of the spectrum. Thus, an interference with the adjacent channels 2 and 4 is caused. In a mobile communication system, this leads to a degraded communication quality for the users.

Several different solutions have been proposed to cope with this situation. One solution is the so-called predistortion method. According to this method, a predistortion signal is added to the input signal of a power amplifier. The predistortion signal is chosen such that the distortion generated in the power amplifier is cancelled. The basic structure according to this solution is shown in FIG. 8, according to which a predistorter 61 adds a predistortion signal to a use signal x(t) which is to be amplified by a power amplifier 62. The non-linear distortion generated in the power amplifier 62 is eliminated as described in the following.

The distortion caused by the power amplifier can be expressed by $$y(t)=Ag(t)$$

where A is a linear gain and g is a distortion function.

The predistorter 61 adds a predistortion to the signal:

$$x'(t)=p(x(t))$$

where x(t) is the original signal, p is a predistortion function and x'(t) is the input signal to the power amplifier 62.

Thus, the output signal of the power amplifier 62 is $$y(t)=Ag(p(x(t)))$$

If the function p is inverse to the function of g ($p=g^{-1}$), the resultant output signal is:

$$y(t)=Ag(g-1(x(t)))=Ax(t).$$

Hence, the distortion is cancelled.

The predistortion can be implemented in analogue form or can be effected by digital signal processing. In the latter case, a digital-analogue converter and a band-pass filter have to be provided between the predistorter 61 and the power amplifier 62.

On the other hand, as mentioned above, in a transmitting system a modulation has to be performed, in which an intermediate frequency signal (IF signal) is generated from in-phase and quadrature-phase signals (I and Q signals). For this purpose, the I signal and the Q signal are multiplied with a sine signal and a cosine signal, respectively. This modulation is usually performed in analogue form, but recently also a digital processing of this modulation has been proposed. This is called a DDS (Direct Digital Synthesis) and vector modulation. The basic structure of the DDS and vector modulation is shown in FIG. 9. The input baseband signals IIN_BB and QIN_BB are supplied to upsampling means 71 and 72, respectively.

Upsampling means (interpolation means) include a sample rate expander and a low pass filter. For example, samples are read into the upsampling means by 4 MSPS (million samples per second) and samples are output by 16 MPSPS. This is done by first adding three zeros between the 4 MPSPS samples, so that the rate is changed to 16 MPSPS. This new sequence is then low-pass filtered in order to eliminate the image caused by the original rate. A sample-rate expansion could also be effected by repeating the original sample, but this adds a sinc-response (in the frequency domain) to the signal and in this case it must be compensated for in the following filter.

The digital baseband signals IIN and QIN output from the upsampling means 71 and 72 are multiplied by multipliers 73 and 74 by an in-phase signal (cosine signal) and a quadrature-phase signal (sine signal), respectively, which are supplied for a DDS carrier generator 76. The output signals of the multipliers 73 and 74 are added by an adder 75, and a resultant IF signal IF_OUT is output.

Conventionally, this output signal IF_OUT is converted to an RF signal and then supplied to an RF power amplifier in order to supply it to an antenna. Hence, for a whole modulation and amplifier system, a complicated structure is required wherein first the modulation and then a linearisation of the power amplifier have to performed, which can be effected by the predistortion as described above, for example. Thus, a large space is required for the whole circuit.

Moreover, due to the large number of separate units, the signals are affected by noises, especially when the above mentioned linearisation using the predistortion method is performed in an analogue form.

On the other hand, if it is performed in digital form, digital-analogue and analogue-digital converters have to be included which in addition can cause degradation of the signals.

SUMMARY OF THE INVENTION

Hence, the object underlying the present invention resides in providing a device by which the above described drawbacks are removed.

This object is achieved by a linearisation and modulation device according to the present invention for a power amplifier. The linearisation and modulation device according to the invention comprises a digital vector modulator for generating a modulated digital signal on the basis of digital baseband signals and digital carrier signals; a correction value generating means for generating an amplitude correction value and a phase correction value on the basis of said digital baseband signals and on the basis of a non-linearity distortion generated in said power amplifier arranged in a subsequent stage; an amplitude correction means for generating a corrected digital signal on the basis of said modulated digital signal and said amplitude correction value; a phase correction means for generating a corrected phase control signal on the basis of said phase correction value and an output signal of a phase control signal generation means; and a carrier signal generating means for generating said carrier signals on the basis of an output of said phase correction means.

With such a device, a compact device can be constructed in which the modulation and the linearisation are performed simultaneously.

Thus, in case the modulation and linearisation device according to the invention is applied in a transmitting system for mobile communication, for example, the system can be made very compact.

Furthermore, since the digital predistortion and the modulation are performed together in one circuit, the system is less affected by disturbances.

Further advantageous developments are defined in the dependent claims.

BRIEF DESCRIPTION OF THE DRAWINGS

The present invention will be more readily understood with reference to the accompanying drawings in which.

DETAILED DESCRIPTION OF PREFERRED EMBODIMENTS

In the following, embodiments of the invention are described in more detail with reference to the accompanying drawings.

Figure 1:
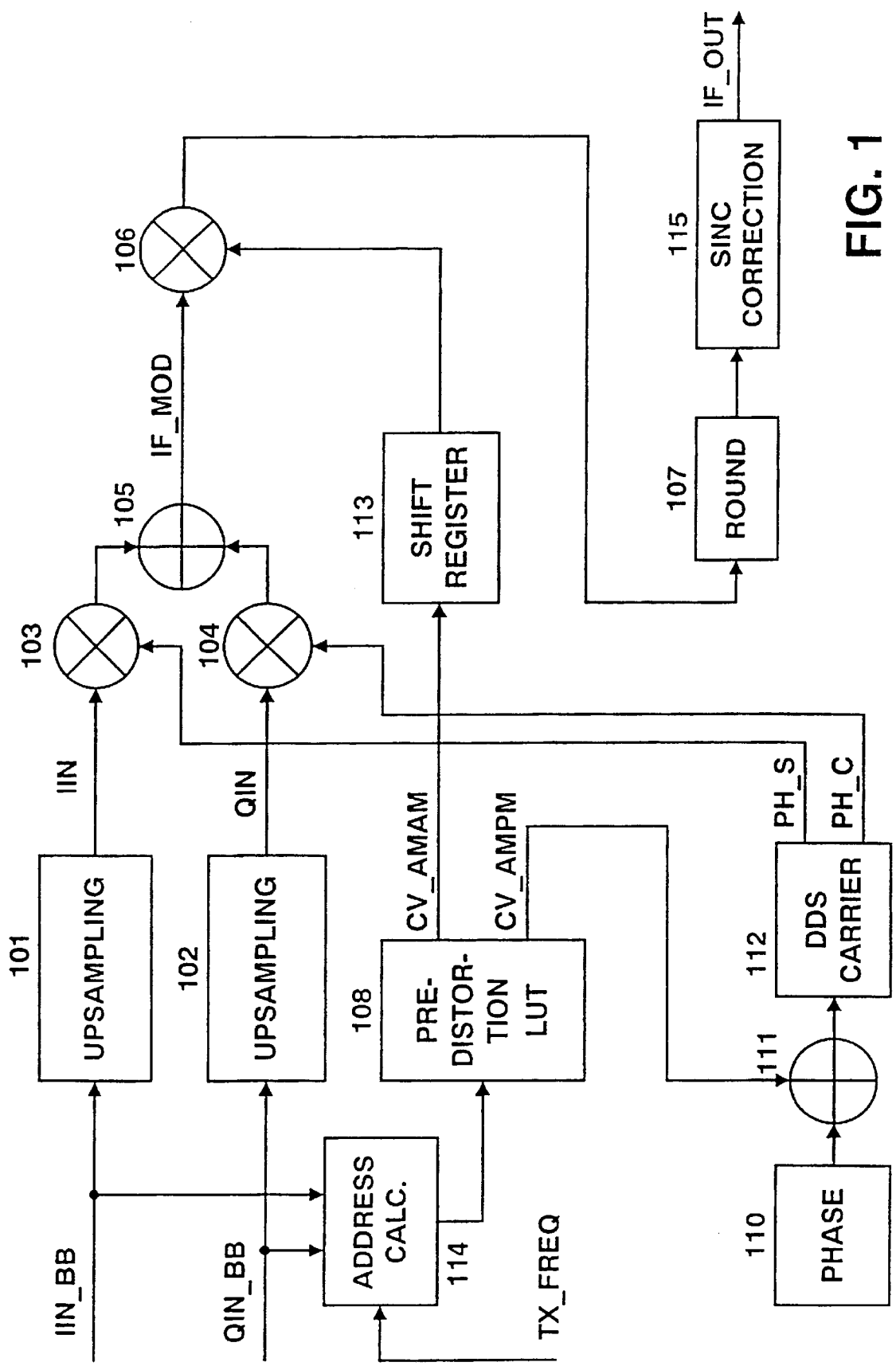
FIG. 1 shows the structure of a combined digital predistortion and DDS vector modulator for an RF power amplifier according to a first embodiment of the invention.

FIG. 1 shows the general construction of a combined digital predistortion and DDS vector modulation linearisation device (in the following referred to as a linearisation and modulation device) according to the invention.

Reference numeral 101 denotes an upsampling means receiving a digital in-phase (I) signal IIN_BB for upsampling I signal IIN_BB. This is effected as mentioned above, that is, by increasing the sample rate (adding zero values between the original sample values) and by low pass filtering the expanded signal. The upsampling means 101 outputs a digital I signal IIN which is supplied to a first multiplier 103. Reference numeral 102 denotes an upsampling means receiving a digital quadrature-phase (Q) signal QIN_BB similar to the upsampling means 101. The upsampling means 102 outputs a digital quadrature-phase signal QIN which is supplied to a second multiplier 104. The multipliers 103 and 104 receive a sine signal (quadrature-phase signal) PH_S and a cosine signal (in-phase signal) PH_C, respectively, supplied from a DDS carrier generation means 112 which will be described later. The outputs of the multipliers 103 and 104 are supplied to an adder 105. The output signal of the adder 105 represents a modulated IF (intermediate frequency) signal IF_MOD.

Reference numeral 114 denotes an address calculation means which calculates an address in a predistortion LUT (look up table) 108 based on the input signals IIN_BB and QIN_BB and on a transceiver frequency TX_FREQ. In the predistortion LUT 108, a plurality of correction values are stored which are necessary to cancel a distortion generated in a power amplifier connected after the linearisation and modulation device. Based on the input signals IIN_BB and QIN_BB and TX_FREQ, the appropriate correction values for cancelling a distortion generated in a power amplifier are read out. The correction values comprise an amplitude correction value CV_AMAM and a phase correction value CV_AMPM. Both this value are needed to cancel the distortion generated in the power amplifier. Thus, the predistortion LUT 108 represents a correction value generating means.

Figure 2:
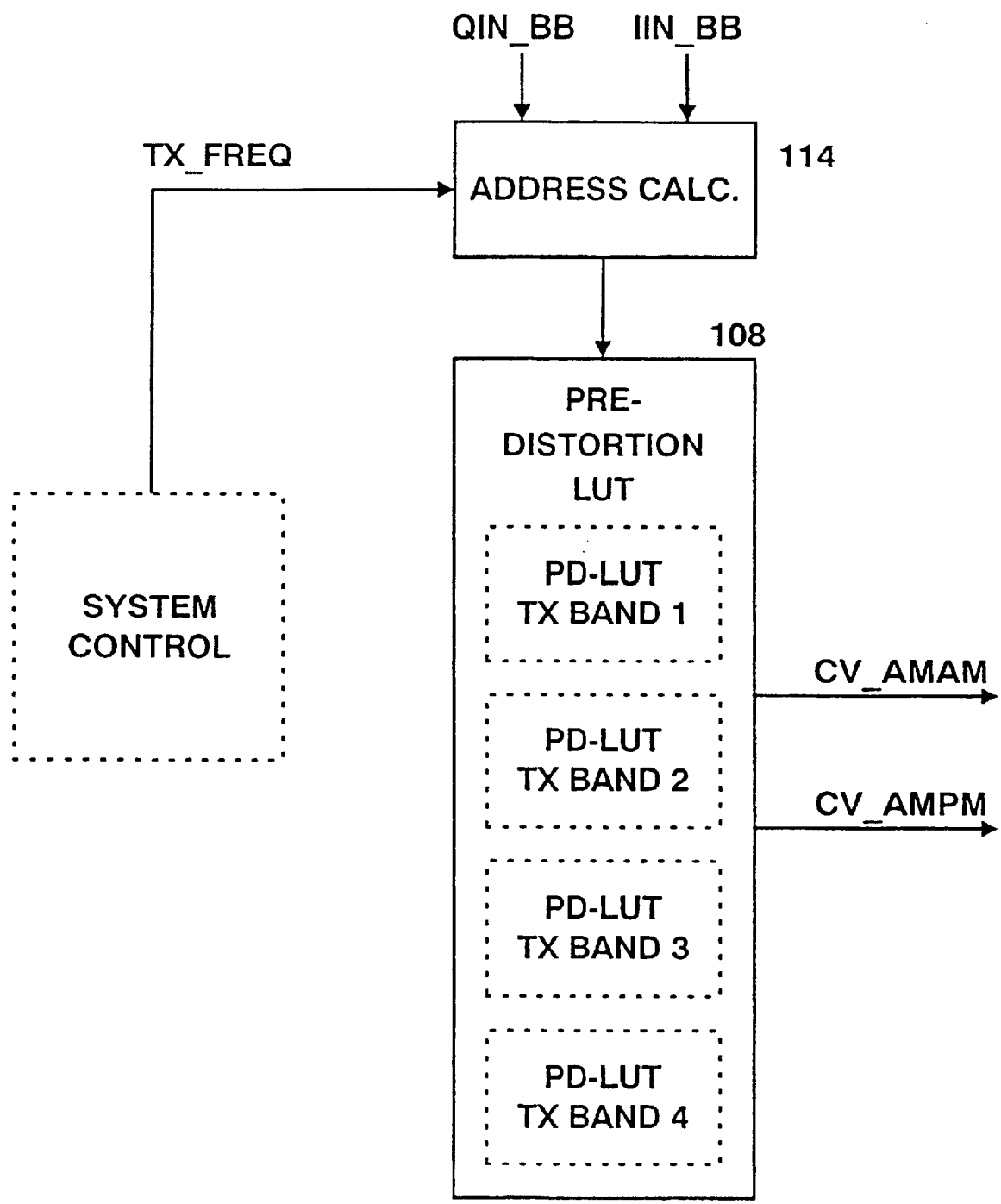
FIG. 2 shows a predistortion LUT of FIG. 1 in more detail.

In FIG. 2 the address calculation means 114 and the predistortion LUT 108 are shown in more detail. The signal TX_FREQ indicating the transmitting frequency is provided by a system controller. In the predistortion LUT 108 a plurality of sections PD-LUT TX BAND 1 to 4 are provided, each section comprising correction value for a specific frequency. Thus, a coarse frequency dependence of the predistortion can be provided.

Nevertheless, it has to be noted that the predistortion and linearisation device shown in FIG. 1 can also be operated without using the frequency information. That is, the predistortion correction values can be determined based only on the baseband signals IIN_BB and QIN_BB. For example, in case the frequency dependence of the power amplifier is tolerable or in case usually only one fixed transmitting frequency is used, the use of the frequency information can be omitted.

The phase correction value CV_AMPM read out of the predistortion LUT 108 is supplied to an adder 111. The adder 111 further receives a phase control signal from a phase accumulator (phase control signal generating means) 110. The adder outputs a corrected phase control signal in which the phase is shifted relative to the input phase control signal according to the phase correction value CV_AMPM. Hence, the adder 11 represents a phase correction means.

The corrected phase control signal of the adder 111 is supplied to the above mentioned DDS carrier signal generating means 112 which outputs a digital sine phase signal PH_S and a digital cosine phase signal PH_C which are supplied to the multipliers 103 and 104, respectively.

The amplitude correction signal CV_AMAM is supplied to a shift register 113 serving to match a signal delay caused by the multipliers 103 and 104 and the adder 105. The output of the shift register 113 is supplied to a further multiplier 106. Furthermore, the multiplier 106 receives the modulated IF signal IF_MOD of the adder 105. Thus, the multiplier 106 multiplies the modulated IF signal IF_MOD by the amplitude correction value CV_AMAM. Thus, the multiplier 106 represents an amplitude correction means.

The output of the multiplier 106 is supplied to a rounding means 107 for rounding the resultant signal on an appropriate bit number, for example, 12 bits, as required for a subsequent stage to which the output signal IF_OUT is supplied.

Moreover, a sinc correction means 115 is provided which compensates the output signal IF_OUT for the sinc response caused by a D/A converter in a following stage.

Thus, in the linearisation and modulation device according to the first embodiment of the invention, the linearisation of a power amplifier in a subsequent stage, i.e., the predistortion of the intermediate frequency signal is effected in the modulator. That is, the phase is corrected in the adder 111, i.e., the phase correction means, and the amplitude is corrected in the multiplier 106, i.e., the amplitude correction means. Thus, a compact structure of the linearisation and modulation device is achieved.

According to the first embodiment, the linearisation is performed by adding predetermined predistortion correction values which are selected only in dependence on the input baseband signals IIN_BB and QIN_BB. The use of fixed predetermined values is sufficient in case the characteristic of the power amplifier does not change during operation. That is, the amplifier parameters may not deviate from preset values or only deviate to a relative small amount.

However, in practise, this condition cannot always be met. Therefore, an adaptation of the linearisation, i.e. an adaptation of the correction values is to be preferred. A linearisation and modulation device in which such an adaptation is applied is hereinafter described as a second embodiment of the present invention with respect to FIGS. 3 and 4.

Figure 3:
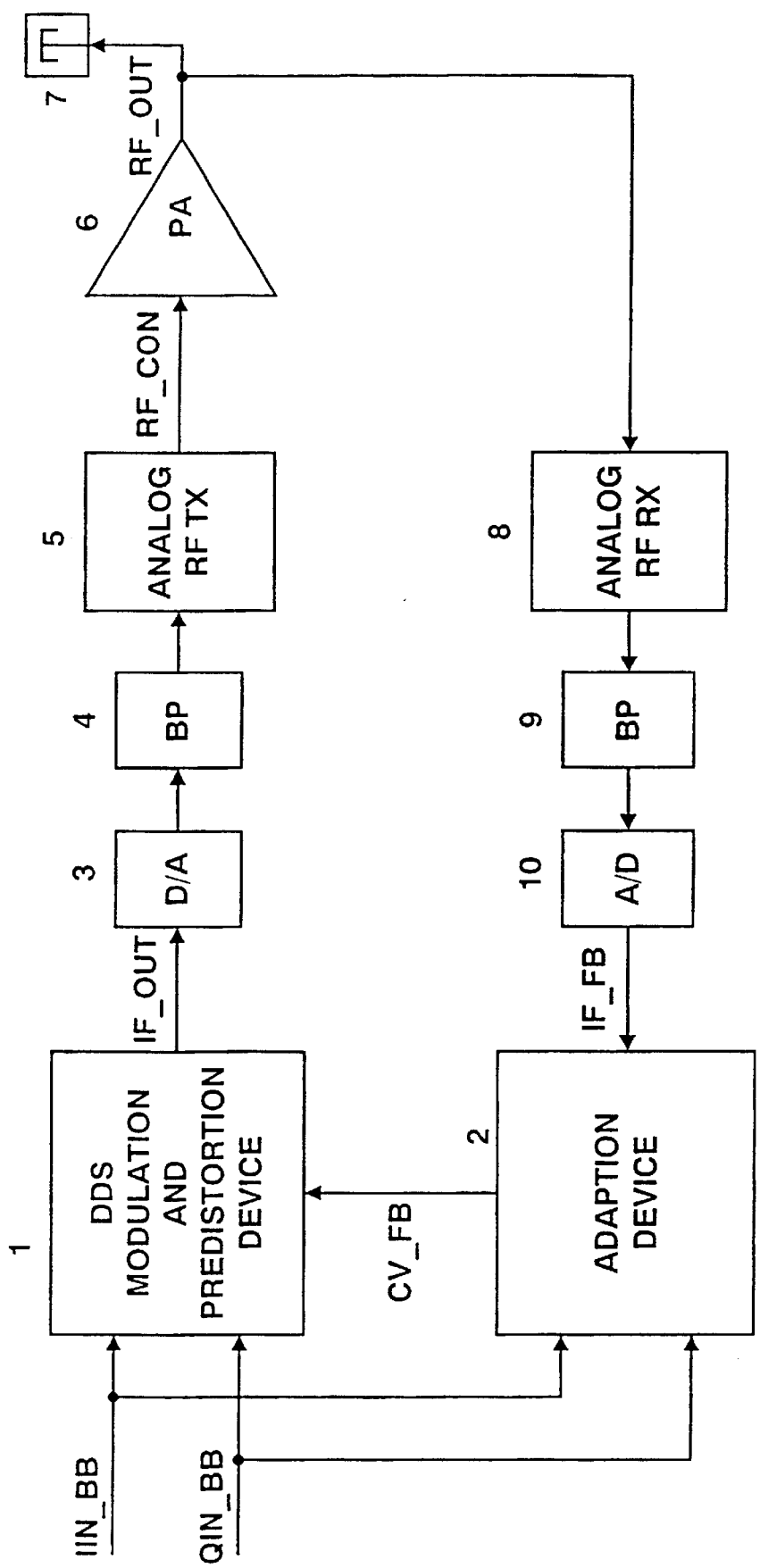
FIG. 3 shows a combined digital predistortion and DDS vector modulator included in a feedback linearisation system according to a second embodiment.

FIG. 3 shows a linearisation system including such an adaptation. Reference numeral 1 denotes a linearisation and modulation device according to the second embodiment. The linearisation and modulation device 1 supplies an output signal IF_OUT to a digital-analogue converter 3 which supplies an output signal to a band-pass filter 4. The analogue output signal of the band-pass filter 4 is supplied to an analogue high frequency transmission circuit (analogue RF TX) 5 in which the analogue IF signal is upconverted to a desired TX frequency. The digital-analogue converter 3, the band-pass filter 4 and the analogue RF TX 5 serve as a signal converting means for converting the digital intermediate frequency signal IF_OUT to an analogue RF signal RF_CON.

The analogue RF signal RF_CON is supplied to a power amplifier 6 which amplifies the analogue RF signal and supplies the resultant RF signal RF_OUT to an antenna 7.

In the feedback path, correction values are obtained from the RF signal RF_OUT. For this purpose, a receiver structure is included in the feedback path. In detail, the RF signal RF_OUT is supplied to an analogue RF receiver circuit (analogue RF RX) 8 which downconverts the RF signal. The output signal of the analogue RF RX 8 is supplied to a band-pass filter 9 which supplies its output signal to an analogue-digital converter 10. The analogue-digital converter 10 outputs a digital feedback signal IF_FB. Thus, the analogue RF RX 8, the band-pass filter 9 and the analogue-digital converter 10 serve as a signal de-converting means for converting the analogue RF signal RF to the digital feedback signal IF_FB.

The digital feedback signal IF_FB is supplied to the adaptation device 2. The adaptation device 2 also receives the baseband signals IIN_BB and QIN_BB. Based on the feedback signal IF_FB and the baseband signals IIN_BB and QIN_BB, the adaptation device 2 generates a feedback correction value CV_FB. The feedback correction value CV_FB is supplied to the linearisation and modulation device 1.

Figure 4:
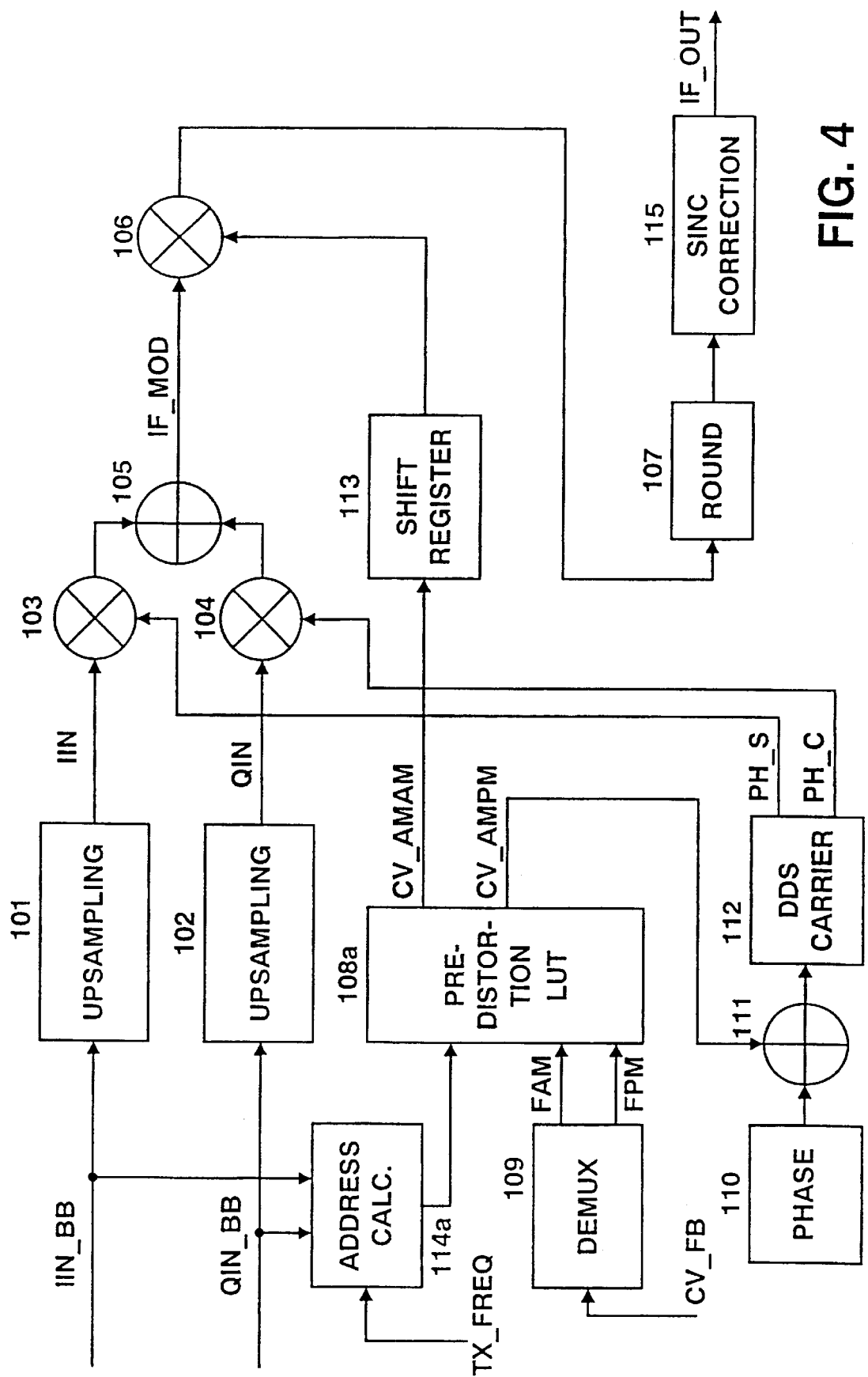
FIG. 4 shows the combined digital predistortion and DDS vector modulator of FIG. 3.

The linearisation and modulation device 1 is described in more detail with respect to FIG. 4. The linearisation and modulation device 1 according to the second embodiment is basically the same as that according to the first embodiment described with reference to FIG. 1, with the exception that the predistortion LUT is modified. According the second embodiment, the modified predistortion LUT 108a is a dual-port RAM. That is, new amplitude and phase correction values FAM and FPM can be written into the predistortion LUT 108a while the predistortion values CV_AMAM and CV_AMPM are read out via the first port. The new correction values FAM and FPM are generated from the feedback correction value CV_FB by means of a demultiplexer 109.

The new correction values are written into the predistortion LUT 108a at an address which is determined in the same way as during reading out the predistortion values CV_AMAM and CV_AMPM, i.e. by using the baseband signals QIN_BB and IIN_BB and also the frequency TX_FREQ, if desired. This is effected by an accordingly adapted address calculation means 114a.

Thus, by the above adaptation, correct predistortion values can always be provided such that changes of the characteristic of the power amplifier can be taken into account and a precise predistortion can be obtained.

Mathematically, the above described linearisation method according to the second embodiment can be expressed by the following formula:

The original output signal IF_OUT of the DDS modulation and predistortion means 1 can be expressed as $$IF\_OUT = A \cdot e^{\phi(t)}$$

where:

$$A = \sqrt{I(t)^2 + Q(t)^2}$$
$$\Phi = \arctan \frac{Q(t)}{I(t)}$$

The corrected output signal in which the new correction values are taken into account can be expressed as:

$$IF\_OUT = FAM \cdot A \cdot e^{(\phi(t) + FPM)}$$

wherein FAM represents the amplitude correction and FPM represents the phase correction.

In the following, the adaptation device 2 according to the second embodiment is described in more detail. The calculation of the feedback correction values can be based on 1) a comparison of input and feedback vectors, or 2) a measurement of adjacent channel power.

Figure 5:
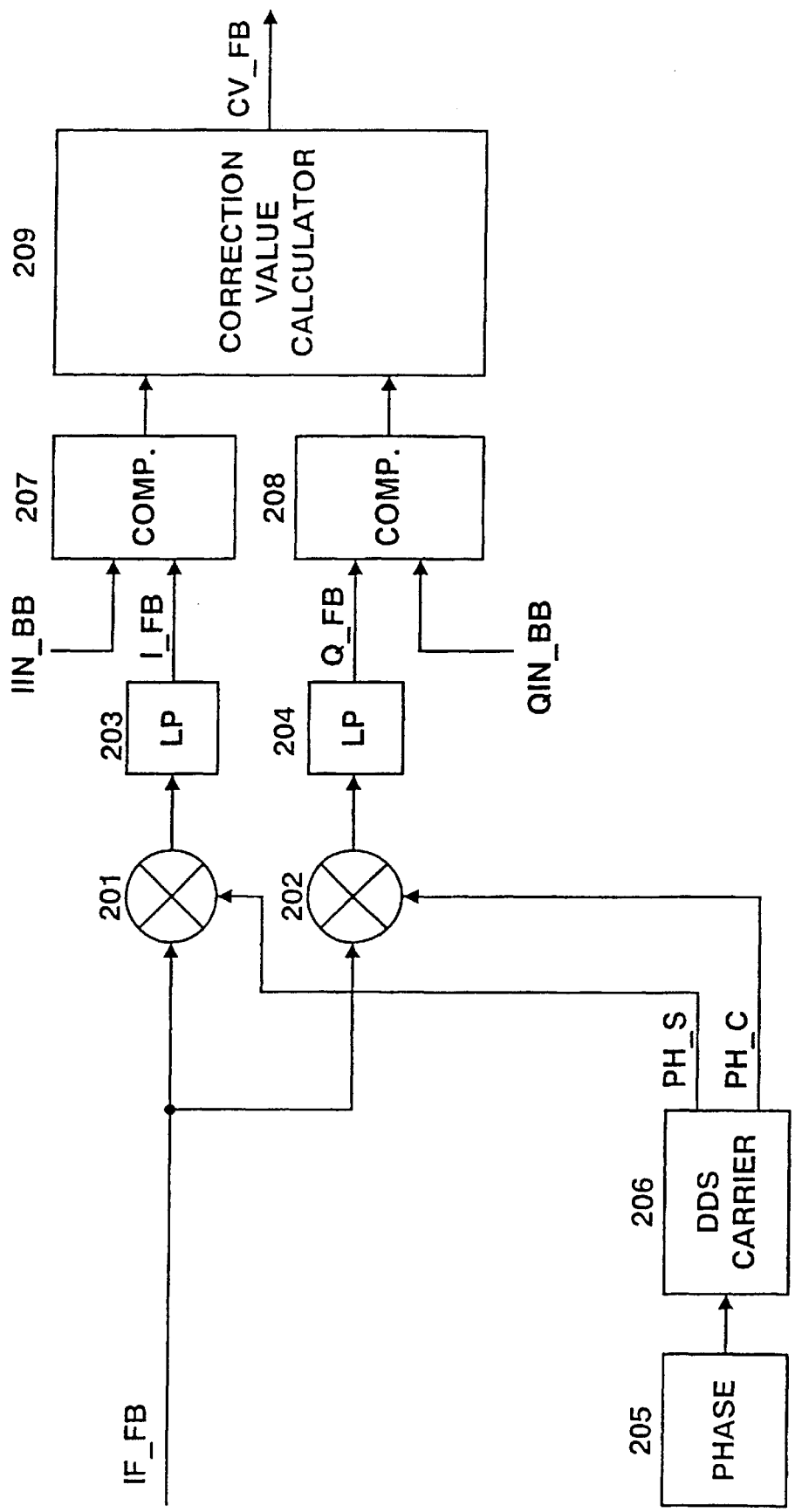
FIG. 5 shows a DDS vector modulator used in an adaptation device 2 shown in FIG. 3.
Figure 6:
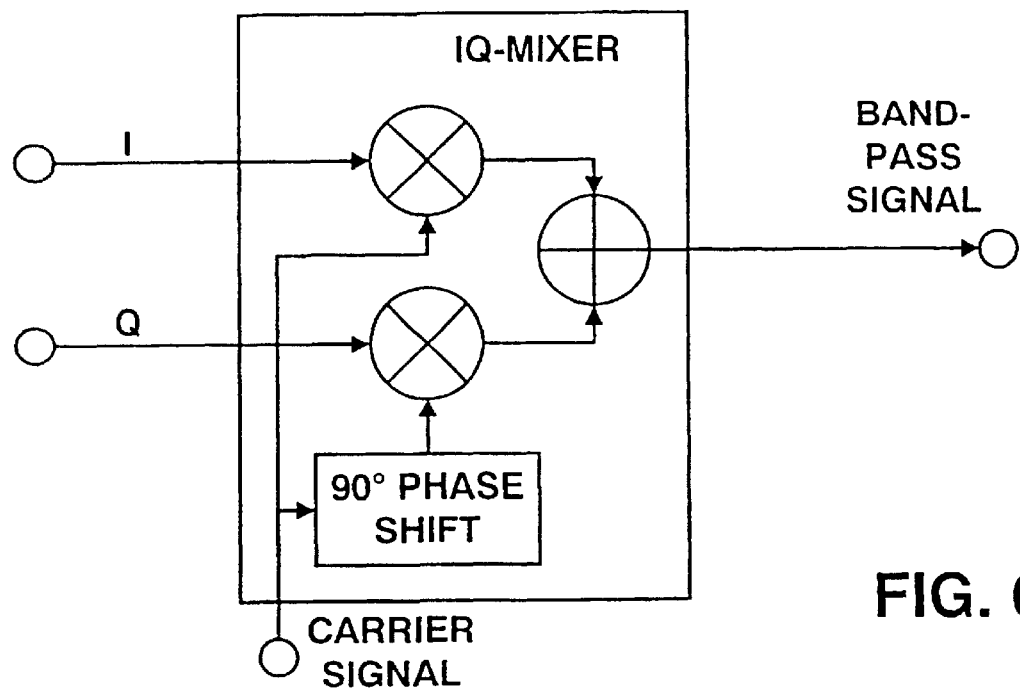
FIG. 6 shows a an IQ-mixer.
Figure 7:
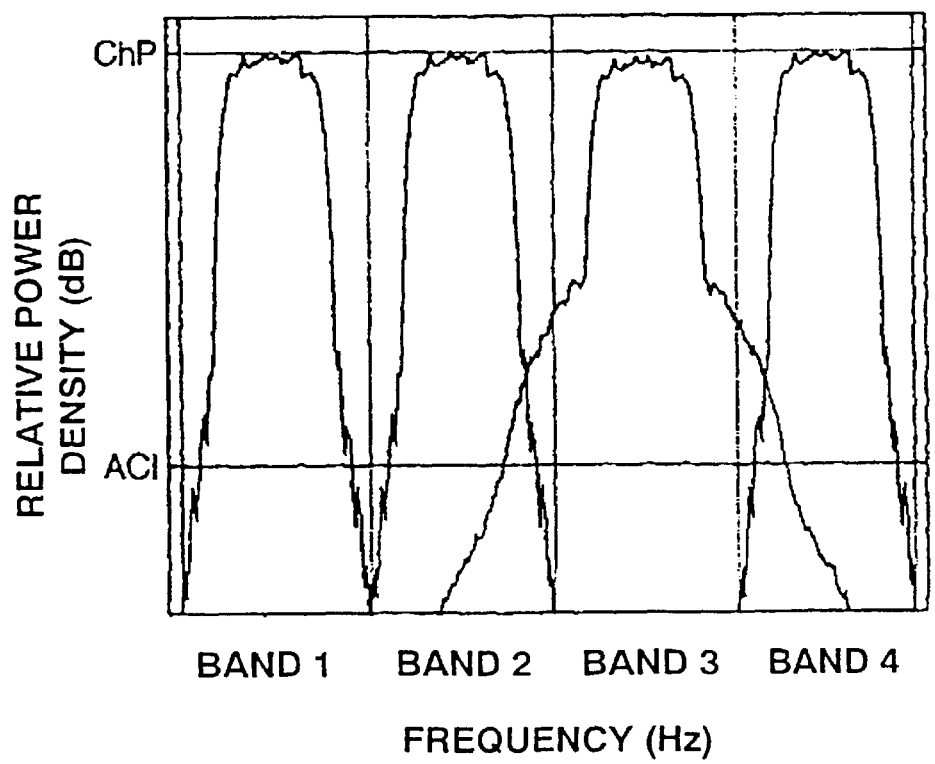
FIG. 7 shows a spectrum widening caused by a non-linear amplifier.
Figure 8:
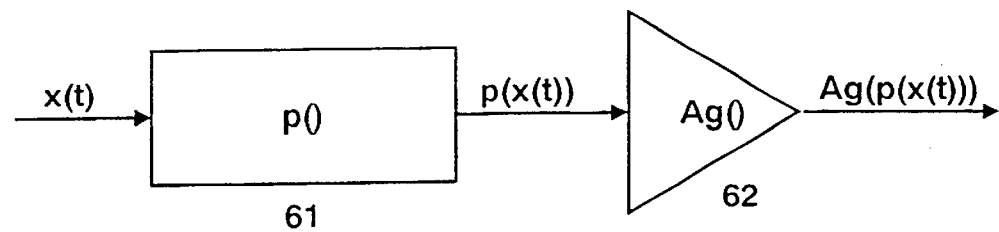
FIG. 8 shows a power amplifier with a predistorter.
Figure 9:
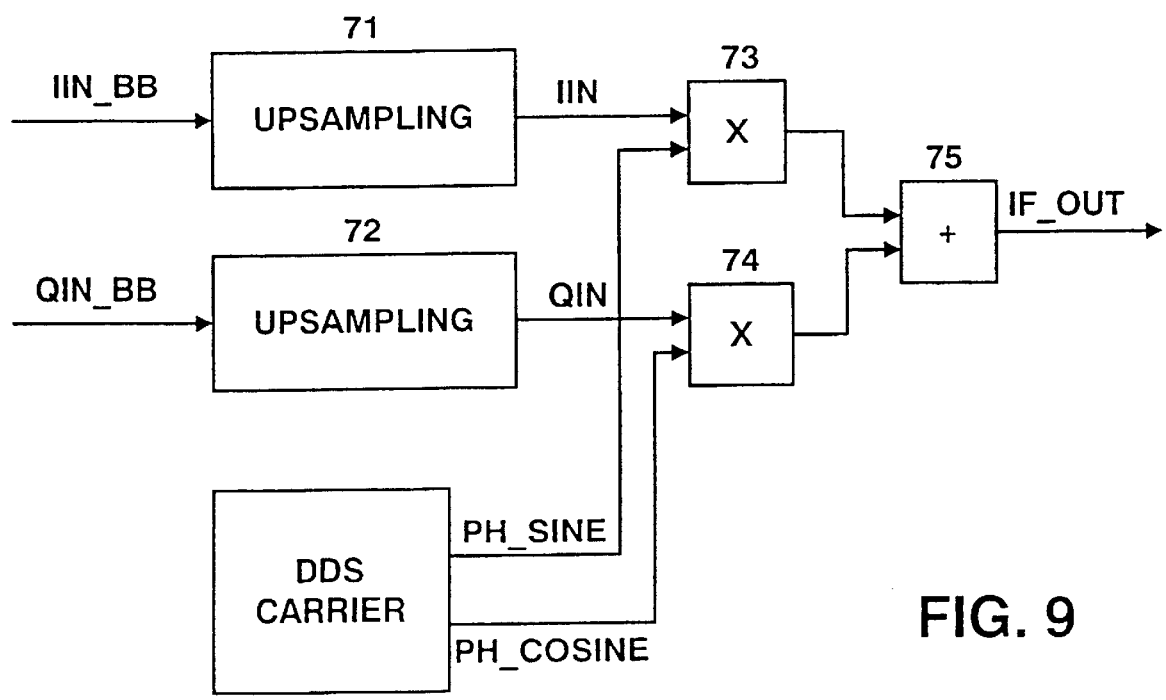
FIG. 9 shows a vector modulator with DDS carriers.

The comparison between the input vector IN_BB consisting of the components IIN_BB and QIN_BB, and the feedback vector IF_FB is described in more detail with reference to FIG. 5. The input vector IN_BB is already decomposed in its components IIN_BB and QIN_BB. In order to decompose the feedback vector IF_FB, it is supplied to two multipliers 201 and 202. The multipliers also receive a sine signal PH_S and a cosine signal PH_C, respectively, which are supplied from a DDS carrier generating means 206. The DDS carrier generating means 206 generates the sine and cosine signals on the basis of a phase control signal received from a phase accumulator 205.

Thus, the multipliers generate an in-phase signal and a quadrature-phase signal which are supplied to digital low-pass filters 203 and 204, respectively.

The outputs I_FB and Q_FB of the digital low-pass filters 203 and 204 are supplied to comparators 207 and 208, respectively. The outputs of the comparators 207 and 208 represent the differences between the components of the input vector IN_BB and the feedback vector IF_FB and are supplied to a correction value calculator 209. The correction value calculator 209 calculates a new correction value CV_FB. It is to be noted that CV_FB is a vector.

The correction values are calculated after adjusting the time delay between the input vector IN_BB and the feedback vector IF_FB. The correction value for a single table place (indicated with k+1) can be calculated by using the following formula:

$$F\_new(k+1)=F\_old(k)+a\cdot\{(IN\_BB(n)-IF\_FB(n)\cdot conj(IN\_BB(n))\}$$

where

F_new(k) is the new value for a table place k,

F_old(k) is the old value in a table place k, a is an adaptation factor that controls the convergence speed and stability of the adaptation, IN_BB(n) is the input vector, IF_FB(n) is the feedback vector, n is the sample time, and Δn is the time delay in the loop from the predistortion device to the adaptation device.

Furthermore, the vectors IN_BB (n) and IF_FB(n) are complex numbers. It is noted that the correction values are presented in polar coordinates.

The address is calculated on the basis of the table size TS:

$$k=\text{round}(TS\cdot\sqrt{IN\_BB(n)^2})$$

where the expression $\sqrt{IN\_BB(n)^2}$ is normalized, that is, this expression assumes values between 0 and 1.

A conversion to polar coordinates can be effected as follows:

$$F = Fi + Fq \Rightarrow FAM = \sqrt{(Fi)^2 + (Fq)^2}$$

$$FPM = \arctan\frac{Fq}{Fi}$$

When the phase error is small, FPM can be expressed as:

$$FPM = \frac{Fq}{Fi}$$

The above description and accompanying drawings only illustrate the present invention by way of example. Thus, the embodiments of the invention may vary within the scope of the attached claims.

I claim:

1. A linearisation and modulation device in a power amplifier, comprising
    a digital vector modulator for generating a modulated digital signal (IF_MOD) on the basis of digital baseband signals (IIN, QIN) and digital carrier signals (PH_S, PH_C);
    a correction value generating means for generating an amplitude correction value (CV_AMAM) and a phase correction value (CV_AMPM) on the basis of said digital baseband signals (IN, QIN) and on the basis of a non-linearity distortion generated in said power amplifier arranged in a subsequent stage;
    an amplitude correction means for generating a corrected digital signal (IF_OUT) on the basis of said modulated digital signal (IF_MOD) and said amplitude correction value (CV_AMAM);
    a phase correction means for generating a corrected phase control signal on the basis of said phase correction value and an output signal of a phase control signal generation means; and
    a carrier signal generating means for generating said carrier signals (PH_S, PH_C) on the basis of an output of said phase correction means.

2. A linearisation and modulation device according to claim 1, wherein said digital vector modulator comprises
    a first multiplying means for multiplying a first one of said digital baseband signals (IIN_BB) by a first one of said digital carrier signals (PH_S);
    a second multiplying means for multiplying a second one of said digital baseband signals (QIN_BB) by a second one of said digital carrier signals (PH_C); and
    an adding means for adding output signals of said first multiplying means and said second multiplying means.

3. A linearisation and modulation device according to claim 1, wherein said correction value generating means comprises a look-up-table and said amplitude and phase correction values (CV_AMAM, CV_AMPM) are read out on the basis of said digital baseband signals (IIN_BB, QIN_BB).

4. A linearisation and modulation device according to claim 3, wherein said amplitude and phase correction values (CV_AMAM, CV_AMPM) are read out on the basis of said digital baseband signals (IIN_BB, QIN_BB) and also on the basis of a transmitting frequency (TX_FREQ).

5. A linearisation and modulation device according to claim 3, wherein said look-up-table is adapted such that it can be updated by with a new correction value (CV_FB).

6. A linearisation and modulation device according to claim 5, wherein said correction value (CV_FB) is supplied from an adaptation device which receives as inputs said digital baseband signals (IIN_BB, QIN_BB) and a digital feedback signal (IF_FB) which corresponds to said corrected digital signal (IF_OUT).

7. A linearisation and modulation device according to claim 6, comprising
    a signal converting means for generating an analogue signal (RF_CON) on the basis of said corrected digital signal (IF_OUT);
    a power amplifier for amplifying said analogue carrier signal (RF_CON) and outputting an amplified carrier signal (RF_OUT); and
    a signal de-converting means for generating said digital feedback signal (IF_FB) on the basis of said amplified carrier signal (RF_OUT).

8. A linearisation and modulation device according to claim 6, wherein said correction value generating means and said adaptation means are constructed as one unit which calculates said phase correction value (CV_AMPM) and said amplitude correction value (CV_AMAM) directly on the basis of said baseband signals (IIN, QIN) and said feedback correction value (IF_FB).

9. A linearisation and modulation device according to claim 1, wherein said amplitude correction means comprises a multiplier which multiplies said modulated digital signal (IF_MOD) by said amplitude correction value (CV_AMAM).

10. A linearisation and modulation device according to claim 1, wherein said phase correction means comprises an adder which adds said phase correction value and said output signal of said phase control signal generation means.

11. A linearisation and modulation device according to claim 1, wherein said digital baseband signals comprise a digital in-phase signal (IIN_BB) and a digital quadrature-phase signal (QIN_BB).

12. A linearisation and modulation device according to claim 1, wherein said modulated digital signal (IF_MOD) is a modulated digital intermediate frequency signal.

13. A linearisation and modulation device according to claim 1, wherein said corrected digital signal (IF_OUT) is a corrected digital intermediate frequency signal.

* * * * *